United States Patent
Weimar et al.

(10) Patent No.: US 10,424,565 B2
(45) Date of Patent: Sep. 24, 2019

(54) SEMICONDUCTOR CHIP FOR PROTECTING AGAINST ELECTROSTATIC DISCHARGES

(71) Applicant: OSRAM Opto Semiconductors GmbH, Regensburg (DE)

(72) Inventors: Andreas Weimar, Regensburg (DE); Frank Singer, Regenstauf (DE); Anna Kasprzak-Zablocka, Donaustauf (DE); Sabine vom Dorp, Altdorf (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 15/303,436

(22) PCT Filed: Mar. 18, 2015

(86) PCT No.: PCT/EP2015/055671
§ 371 (c)(1),
(2) Date: Oct. 11, 2016

(87) PCT Pub. No.: WO2015/154956
PCT Pub. Date: Oct. 15, 2015

(65) Prior Publication Data
US 2017/0033092 A1 Feb. 2, 2017

(30) Foreign Application Priority Data
Apr. 11, 2014 (DE) .................. 10 2014 105 188

(51) Int. Cl.
*H01L 25/16* (2006.01)
*H01L 33/48* (2010.01)
(Continued)

(52) U.S. Cl.
CPC .......... *H01L 25/167* (2013.01); *H01L 23/481* (2013.01); *H01L 23/60* (2013.01);
(Continued)

(58) Field of Classification Search
CPC ....... H01L 2924/00014; H01L 2924/00; H01L 2224/48091; H01L 2924/12041;
(Continued)

(56) References Cited

U.S. PATENT DOCUMENTS 8,125,056 B2  2/2012  Tsai et al.
8,164,113 B2  4/2012  Lin et al.
(Continued)

FOREIGN PATENT DOCUMENTS

CN  102227807 A  10/2011
CN  102473814 A  5/2012
(Continued)

Primary Examiner — David Chen
(74) Attorney, Agent, or Firm — Slater Matsil, LLP (57) ABSTRACT

A semiconductor chip, an optoelectronic device including a semiconductor chip, and a method for producing a semiconductor chip are disclosed. In an embodiment the chip includes a semiconductor body with a first main surface and a second main surface arranged opposite to the first main surface, wherein the semiconductor body includes a p-doped sub-region, which forms part of the first main surface, and an n-doped sub-region, which forms part of the second main surface and a metallic contact element that extends from the first main surface to the second main surface and that is electrically isolated from one of the sub-regions.

12 Claims, 5 Drawing Sheets

(51) Int. Cl.
*H01L 33/62* (2010.01)
*H01L 23/60* (2006.01)
*H01L 23/48* (2006.01)
H01L 27/02 (2006.01)
H01S 5/068 (2006.01)

(52) U.S. Cl.
CPC ............ *H01L 33/486* (2013.01); *H01L 33/62* (2013.01); *H01L 27/0248* (2013.01); *H01L 27/0292* (2013.01); *H01L 2924/0002* (2013.01); *H01L 2924/12035* (2013.01); *H01L 2924/12036* (2013.01); *H01L 2924/12041* (2013.01); *H01S 5/06825* (2013.01)

(58) Field of Classification Search
CPC ........... H01L 33/62; H01L 2924/12035; H01L 33/486; H01L 2924/12036
USPC ...................... 257/81, 84, E25.032
See application file for complete search history.

(56) References Cited

U.S. PATENT DOCUMENTS

| | | | |
|---|---|---|---|
| 8,723,192 B2 | 5/2014 | Weidner et al. | |
| 8,785,289 B2 | 7/2014 | Kim et al. | |
| 9,590,008 B2 | 3/2017 | Moosburger et al. | |
| 2004/0173814 A1* | 9/2004 | Chang | H01L 29/742 257/147 |
| 2007/0290329 A1 | 12/2007 | Murayama et al. | |
| 2010/0019264 A1 | 1/2010 | Jeong | |
| 2011/0260205 A1 | 10/2011 | Moosburger et al. | |
| 2012/0139002 A1* | 6/2012 | Jang | H01L 33/60 257/99 |
| 2012/0300491 A1* | 11/2012 | Hussell | H01L 24/49 362/602 |
| 2013/0049059 A1 | 2/2013 | Odnoblyudov et al. | |
| 2013/0240922 A1 | 9/2013 | Yamamoto | |
| 2014/0256071 A1* | 9/2014 | Park | H01L 33/46 438/27 |
| 2015/0061084 A1* | 3/2015 | Tsai | H01S 5/0208 257/621 |
| 2016/0013119 A1 | 1/2016 | Yamamoto | |

FOREIGN PATENT DOCUMENTS

| | | |
|---|---|---|
| DE | 102009006177 A1 | 6/2010 |
| DE | 102009013085 A1 | 9/2010 |
| DE | 102009036621 A1 | 2/2011 |
| DE | 112010004326 T5 | 8/2012 |
| EP | 1868245 A2 | 12/2007 |
| JP | 2008021987 A | 1/2008 |
| JP | 2013506296 A | 2/2013 |
| JP | 2016208056 A | 12/2016 |
| KR | 1020070120028 A | 12/2007 |
| TW | 200802996 A | 1/2008 |
| WO | 2011015449 A1 | 2/2011 |
| WO | 2012086517 A1 | 6/2012 |

\* cited by examiner

FIG. 4 ved in the form of a silicon
SEMICONDUCTOR CHIP FOR PROTECTING AGAINST ELECTROSTATIC DISCHARGES This patent application is a national phase filing under section 371 of PCT/EP2015/055671, filed Mar. 18, 2015, which claims the priority of German patent application 10 2014 105 188.2, filed Apr. 11, 2014, each of which is incorporated herein by reference in its entirety.

TECHNICAL FIELD

A semiconductor chip, an optoelectronic device with a semiconductor chip and a method for producing a semiconductor chip are provided.

SUMMARY OF THE INVENTION

Embodiments provide a semiconductor chip that can be used as a protection element against electrostatic discharges (ESD). Furthermore, embodiments provide an optoelectronic device with such a semiconductor chip and a method for producing such a semiconductor chip.

According to at least one embodiment, a semiconductor chip comprises a semiconductor body with a first main surface and a second main surface arranged opposite the first main surface. The semiconductor body may in particular be formed by a semiconductor material which has different conductivity types, i.e. is differently doped, in different sub-regions. For instance, the semiconductor body may comprise at least one p-doped sub-region and at least one n-doped sub-region. In particular, the semiconductor body may comprise silicon or consist substantially thereof. The fact that the semiconductor body consists substantially of silicon means in particular that the semiconductor body comprises as base material silicon which has different conductivity types in sub-regions due to different types of doping. Furthermore, the semiconductor body may for example, as a result of oxidation such as for instance thermal oxidation, comprise electrically insulating regions and/or layers which are formed for example by a silicon oxide such as for instance silicon dioxide.

According to a further embodiment, the semiconductor body is cuboid in shape. This means in particular that the basic shape of the semiconductor body takes the form of a cuboid, wherein the shape of the main surfaces, which are arranged parallel to one another, is in this case rectangular. The term cuboid also covers modifications of a cuboid in the strict mathematical sense. For instance, the cuboid semiconductor body may additionally have surface patterns such as protrusions or indentations and at least one through-opening. As an alternative to rectangular main surfaces, said surfaces may also have another shape. Furthermore, the semiconductor body comprises side faces which connect the main surfaces. In the case of a cuboid semiconductor body, the side faces are rectangular.

According to a further embodiment, the semiconductor body of the semiconductor chip comprises a p-doped sub-region, which forms part of the first main surface, and an n-doped sub-region, which forms part of the second main surface. The fact that a doped sub-region forms part of a main surface means in particular that the doped sub-region may be directly electrically contacted via the corresponding main surface, i.e. that the sub-region extends as far as said main surface and a surface of the doped sub-region forms said part of said main surface.

According to a further embodiment, in a method for producing a semiconductor chip a semiconductor body is provided. The semiconductor body may in particular be doped with a first conductivity type. For example, the semiconductor body provided may be p-doped. The semiconductor body may in particular be provided in the form of a semiconductor wafer, in the case of silicon as the base material of the semiconductor body in the form of a silicon wafer. The silicon wafer may already have the desired doping, for example p-doping. Furthermore, it is also possible to provide an n-doped or an undoped semiconductor body.

According to a further embodiment, a sub-region of the semiconductor body is provided with a second conductivity type different from the first conductivity type. The conductivity types, i.e. the first and second conductivity types, are selected from p-doping and n-doping, such that, after production of the sub-region with the second conductivity type, the semiconductor body comprises a p-doped sub-region and an n-doped sub-region. If, for example, a semiconductor body with p-doping is provided, the semiconductor body is provided in a sub-region with n-doping, such that this part forms the n-doped sub-region while the other part of the semiconductor body forms the sub-region with the p-doping. Alternatively, an n-doped semiconductor body may also be provided, which is p-doped in a sub-region. Furthermore, it is also possible for an undoped semiconductor body to be provided which is provided in a first sub-region with p-doping and in a further sub-region with n-doping.

According to a further embodiment, at least one sub-region of the semiconductor body is provided with a conductivity type by diffusion doping. In this case, a desired dopant is introduced into a sub-region of the semiconductor body by means of diffusion. If a semiconductor body with a specific doping is provided, this doping is overcompensated by the introduction of a further dopant by means of diffusion, such that doping with another conductivity type than that provided is established.

The features and embodiments described above and below apply equally to the semiconductor chip and to the method for producing the semiconductor chip.

According to a further embodiment, in the case of a semiconductor body based on silicon the p-doped sub-region comprises at least one or more dopants selected from boron, indium, aluminum and gallium, while the n-doped sub-region has one or more dopants selected from phosphorus, arsenic and antimony.

According to a further embodiment, the p-doped sub-region and the n-doped sub-region adjoin one another in the semiconductor body and preferably form a diode, which forms a diode part of the semiconductor chip. In particular, the semiconductor chip may be configured, as a result of the p-doped sub-region and the n-doped sub-region of the semiconductor chip, as an ESD protection diode. The respective doping of the p-doped sub-region and of the n-doped sub-region depends on the breakdown voltage requirements of the ESD diode. As an alternative to a pn-diode, which is formed by mutually adjacent p-doped and n-doped sub-regions, the semiconductor body may also comprise multiple p-doped sub-regions and/or multiple n-doped sub-regions and/or undoped sub-regions, which together form a diode part of the semiconductor chip and may enable the desired functionality, in particular an ESD protection function. The semiconductor chip is electrically contacted in particular via the first and second main surfaces of the semiconductor chip. For electrical contacting of the main surfaces, the semiconductor chip may comprise metallization, which in each case covers at least part of the respective main surface.

The sub-region of the first conductivity type may also extend from the first to the second main surface. In the case of a p-doped semiconductor body, in which an n-doped sub-region is produced, the p-doped sub-region may extend from the first to the second main surface.

According to a further embodiment, the semiconductor chip comprises a metallic contact element, which extends from the first to the second main surface and is electrically isolated from one of the sub-regions. The metallic contact element may in particular be electrically isolated from the p-doped sub-region or from the n-doped sub-region. The fact that the metallic contact element is electrically isolated from one of the sub-regions means in particular that the metallic contact element does not have any direct contact with this sub-region. For example, an electrically insulating layer may be arranged between the metallic contact element and the sub-region electrically isolated therefrom. Furthermore, a sub-region of a different conductivity type from the conductivity type of the sub-region electrically isolated from the metallic contact element may be arranged between the metallic contact element and the sub-region electrically isolated therefrom. In particular, the n-doped sub-region may here, for instance, isolate the p-doped sub-region from the metallic contact element. Alternatively, the semiconductor body may comprise an electrically insulating layer, which isolates the p-doped sub-region from the metallic contact element. The metallic contact element forms a direct electrical connection between the first and the second main surfaces of the semiconductor body. This direct electrical connection is formed in the semiconductor body parallel to the diode part formed by the p-doped sub-region and the n-doped sub-region. The semiconductor chip thus comprises on the one hand a diode functionality, in particular in the form of an ESD protection diode, and on the other hand a direct electrical connection provided by the metallic contact element.

According to a further embodiment, the metallic contact element is arranged in an opening in the semiconductor body which extends from the first to the second main surface. To this end, the semiconductor body may be provided with an opening which accordingly extends from the first to the second main surface and in which the metallic contact element is arranged.

According to a further embodiment, the sub-region of the second conductivity type is produced on the second main surface. A surface region of the first main surface surrounding and adjoining the opening is provided with an electrically insulating layer by thermal oxidation or is doped with the second conductivity type by a doping method. This makes it possible to apply an electrical connecting element, such as for instance an electrode layer, in the surface region of the first main surface surrounding and adjoining the opening, said electrode layer being in electrical contact with the metallic contact element but electrically isolated from the sub-region of the semiconductor body of the first conductivity type.

According to a further embodiment, the opening comprises a wall, on which an electrically insulating layer is formed. The electrically insulating layer may be produced for example by applying an electrically insulating material such as for example silicon dioxide. Furthermore, the electrically insulating layer is formed for example by oxidation of the material of the semiconductor body, for instance by thermal oxidation. In the case of a semiconductor body based on silicon, a wall may be produced in this way which is provided by means of thermal oxidation with an electrically insulating layer of silicon oxide.

According to a further embodiment, the metallic contact element is arranged on a side face of the semiconductor body connecting the main surfaces. In other words, the semiconductor body comprises at least one side face connecting the first and second main surfaces and on which the metallic contact element is arranged.

According to a further embodiment, the metallic contact element, which may for example comprise copper and/or nickel or consist thereof, is applied by galvanic deposition or by plating in an opening in the semiconductor body or on a side face of the semiconductor body which connects the first and second main surfaces.

According to a further embodiment, a plurality of semiconductor chips are provided in a composite. To this end, a semiconductor body configured as a semiconductor wafer is in particular provided, in which a plurality of sub-regions with the desired doping and optionally openings and/or trenches are produced next to one another, in or between which metallic contact elements are applied. By singulating the semiconductor wafer after formation of the desired sub-regions and metallic contact elements, a plurality of similar semiconductor chips may be obtained.

According to a further embodiment, once it has been provided the semiconductor body is provided from one side with trenches, so forming projections which are separated from one another by the trenches. The side with the trenches and projections is formed over a large area as a sub-region of the second conductivity type. In other words, the sub-region of the second conductivity type extends over that surface, preferably the entire surface, of the semiconductor body which is configured with the trenches and the projections arranged therebetween. Between the trenches, metallic contact elements may be applied to the projections in the sub-region of the second conductivity type. By singulating the semiconductor body along the trenches, it is possible to produce a plurality of semiconductor chips, the first and second main surfaces of which are produced at least in part as a result of the singulation.

According to a further embodiment, an optoelectronic device comprises a semiconductor chip according to the above description. Furthermore, the optoelectronic device comprises an optoelectronic semiconductor component which is configured to detect or emit light when in operation and which comprises two mutually opposing main surfaces, at least one of which is transmissive to light. The optoelectronic semiconductor component may in particular take the form of an optoelectronic semiconductor chip, for example of a light-emitting diode chip, laser diode chip or photodiode chip. In particular, the optoelectronic semiconductor component may be configured such that it is electrically contacted from both main surfaces, such that it thus has an electrical connection possibility on each of the two mutually opposing main surfaces for electrical contacting of the optoelectronic semiconductor component.

According to a further embodiment, the optoelectronic device comprises a package body, which form-fittingly encloses the semiconductor chip and the optoelectronic semiconductor component on the side faces connecting the respective main surfaces. This means, in other words, that the package body holds the semiconductor chip and also the optoelectronic semiconductor component together over the side faces thereof, while the main surfaces of the semiconductor chip and of the optoelectronic semiconductor component may in each case be at least partly free of the material of the package body. The package body, which in particular takes the form of a molding, may cover the side faces of the semiconductor chip and of the optoelectronic semiconductor component in particular directly and in form-fitting manner. The package body may in this case in particular be molded onto the semiconductor chip and the optoelectronic semiconductor component and surround the semiconductor chip and the optoelectronic semiconductor component in the lateral direction. A "lateral direction" is here understood to mean a direction which is parallel to the main plane of extension of the main surfaces of the semiconductor chip and of the optoelectronic semiconductor component. The side faces of the semiconductor chip and of the optoelectronic semiconductor component may be covered entirely or only over a certain proportion with the package body material, such that the package body may have a height which is less than or equal to the height of the semiconductor chip and/or of the optoelectronic semiconductor component. Furthermore, the package body may also project at least at one main surface beyond the semiconductor chip and/or the optoelectronic semiconductor component and thus have a greater height.

The package body may for example comprise a plastics material, for instance a silicone, an epoxide, a silicone-epoxide hybrid material, a polyester or a low-melting glass or a low-melting glass-ceramic. "Low-melting" here means glasses and glass-ceramics which may be processed in a molding process at temperatures at which the semiconductor chip and the optoelectronic semiconductor component are not damaged. In particular, the package body may form a mechanically stabilizing element, which substantially brings about the stability of the optoelectronic device. The package body may in particular be produced by a molding process, for example injection molding, casting, pressing, foil lamination or the like. For example, the package body may be formed by a transfer molding process, for example a foil-assisted transfer molding process. One method for producing a package body is described, for example, in document WO 2011/015449 A1, the disclosure content of which is hereby included in its entirety by reference.

According to a further embodiment, two mutually isolated electrical connecting elements are arranged on the package body on a mounting side opposite the light-transmitting main surface of the optoelectronic semiconductor component. In other words, the optoelectronic device comprises the two mutually isolated electrical connecting elements on a mounting side which is opposite the light-transmitting main surface of the optoelectronic semiconductor component. The electrical connecting elements on the mounting side serve to interconnect in parallel the semiconductor chip and the optoelectronic semiconductor component. This means, in other words, that one of the electrical connecting elements on the mounting side extends partly over the main surface, facing the mounting side, of the semiconductor chip and over the main surface, facing the mounting side, of the optoelectronic semiconductor component and thus connects the two main surfaces together electrically conductively. The other connecting element, on the other hand, is arranged solely on the main surface of the semiconductor chip facing the mounting side. In particular, one of the connecting elements is connected electrically conductively with the diode formed by the p-doped sub-region and the n-doped sub-region of the semiconductor body of the semiconductor chip, while the other connecting element is connected with the metallic contact element.

According to a further embodiment, a further electrical connecting element is arranged on atop, opposite the mounting side, of the package body of the optoelectronic device, said further electrical connecting element electrically conductively connecting the main surface of the semiconductor chip facing the top of the optoelectronic device with the light-transmitting main surface of the optoelectronic semiconductor component. In this case, the further electrical connecting element on the top of the optoelectronic device may connect the diode part and the metallic contact elements of the semiconductor chip electrically conductively together.

The electrical connecting elements may for example comprise copper and/or nickel, which for example are applied by vapor deposition or by a galvanic deposition method.

The semiconductor chip described here makes it possible to provide a single component, for example for the optoelectronic device described here, which provides both an ESD protection diode function and a direct electrical connection in parallel therewith between the mutually opposing main surfaces. In comparison with conventional devices, in which electrical bushings and protection diodes have to be produced and positioned as separate components, using the semiconductor chip described here this effort can be reduced, since just a single chip has to be positioned in addition to the optoelectronic semiconductor component.

BRIEF DESCRIPTION OF THE DRAWINGS

Further advantages, advantageous embodiments and further developments are revealed by the exemplary embodiments described below in association with the figures, in which.

In the exemplary embodiments and figures, identical, similar or identically acting elements are provided in each case with the same reference numerals. The elements illustrated and their size ratios to one another should not be regarded as being to scale, but rather individual elements, such as for example layers, components, devices and regions, may have been made exaggeratedly large to illustrate them better and/or to aid comprehension.

DETAILED DESCRIPTION OF ILLUSTRATIVE EMBODIMENTS

Figure 1A:
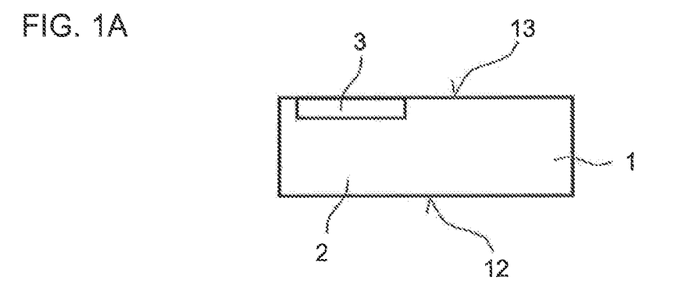
FIGS. 1A to 1G are schematic representations of method steps of a method for producing a semiconductor chip according to an exemplary embodiment.
Figure 1B:
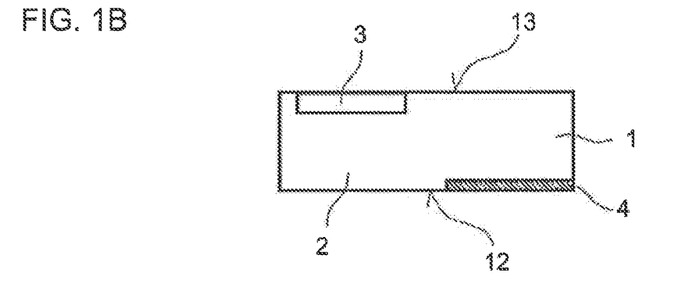
Figure 1C:
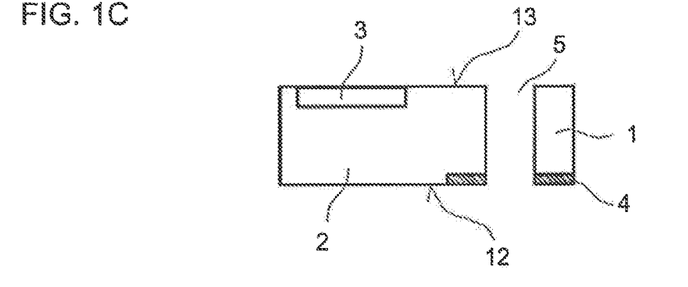
Figure 1D:
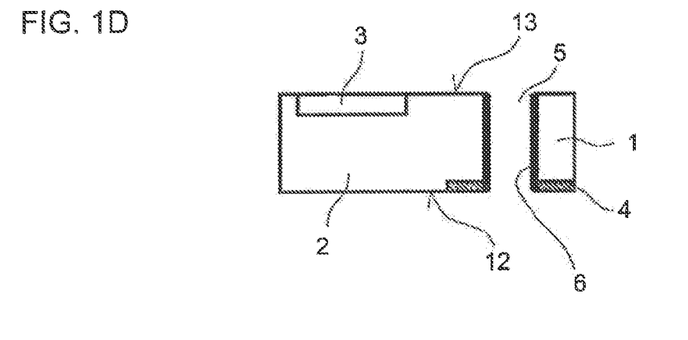
Figure 1E:
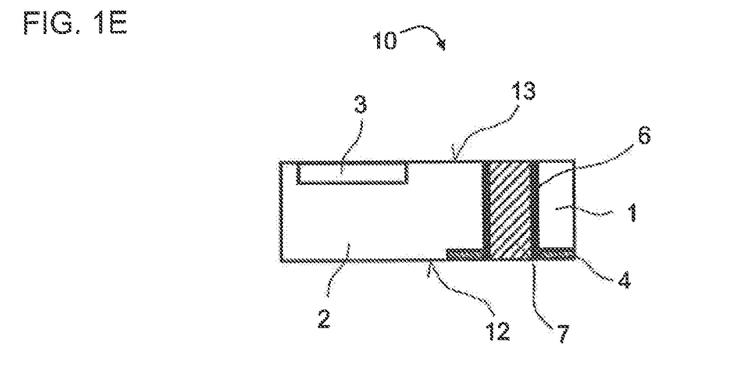

FIGS. 1A to 1G show method steps of a method for producing a semiconductor chip 10 which is configured to provide protection against electrostatic discharges. In particular, the semiconductor chip 10, which is shown in FIG. 1E in a sectional representation, in FIG. 1F in plan view and additionally in FIG. 1G in the form of an equivalent circuit diagram, is provided with a diode part configured as an ESD protection diode and is thus configured inter alia as an ESD protection diode.

In a first method step, a semiconductor body 1 is provided, as shown in FIG. 1A, which is doped with a first conductivity type. A sub-region of the semiconductor body 1 is provided with a second conductivity type different from the first conductivity type, wherein the first and second conductivity types are selected from p-doping and n-doping.

In the exemplary embodiment shown, the semiconductor body 1 comprises silicon, from which the semiconductor body 1 substantially consists. This means that the semiconductor body 1 comprises silicon with doping of a first conductivity type, which in the exemplary embodiment shown is p-doping. By doping a sub-region of the semiconductor body 1 with the second conductivity type, which in the exemplary embodiment shown is accordingly n-doping, the n-doped sub-region 3 is formed, while the remainder of the semiconductor body forms a p-doped sub-region 2. The conductivity types of the sub-regions 2 and 3 may also be the opposite of the present description. The doping of the semiconductor body 1, i.e. the p-doping of the p-doped sub-region 2 and the n-doping of the n-doped sub-region 3, depends on the requirements with regard to the breakdown voltage of the ESD protection diode to be produced.

The semiconductor body 1, which in the exemplary embodiment shown is cuboidal in shape, may for example also be part of a semiconductor wafer such as for instance a silicon wafer, on which the method steps described here and below are performed in a plurality of regions arranged adjacent one another. A plurality of semiconductor chips 10 may then obtained by subsequent singulation of the wafer.

The semiconductor body 1 comprises a first main surface 12 and a second main surface 13, wherein the second main surface 13 is arranged opposite the first main surface 12. The p-doped sub-region 2 forms at least part of the first main surface 12, in the exemplary embodiment shown the entirety of the first main surface 12, while the n-doped sub-region 3 forms part of the second main surface 13. Since the n-doped sub-region 3 is formed merely in a limited area of the second main surface 13, the p-doped sub-region 2 extends from the first main surface 12 to the second main surface 13.

In a further method step, as shown in FIG. 1B, a region of the first main surface 12 is provided with an electrically insulating layer, so producing an electrically insulating region 4. The electrically insulating region 4 is offset laterally relative to the n-doped sub-region 3. A "lateral direction" is here and hereinafter understood to mean a direction parallel to the main surfaces 12, 13. The electrically insulating region 4 may for example be produced by oxidation, for instance by thermal oxidation, of the silicon of the semiconductor body 1. Alternatively, it may also be possible for an electrically insulating layer, for example of silicon oxide, to be applied to the first main surface 12 as an insulating region 4. Furthermore, it may also be possible to dope the region 4 with a conductivity type which differs from the conductivity type of the sub-region 2, i.e. with n-doping in the exemplary embodiment shown. As an alternative to an electrically insulating region 4, it is thus also possible for an n-doped region on the first main surface 12 to be offset laterally relative to the n-doped region 3 on the second main surface 13.

In a further method step, shown in FIG. 1C, an opening 5 extending from the first main surface 12 to the second main surface 13 is formed in the semiconductor body 1, through the electrically insulating region 4.

The configuration of the n-doped sub-region 3 and of the opening 5 may be produced using conventional semiconductor processing methods, in the present case in particular using conventional silicon technology. For instance, the n-doped sub-region 3 may be produced, for example, by diffusion doping.

In a further method step, which is shown in FIG. 1D, the opening 5 is insulated electrically with respect to the semiconductor body 1 and in particular the p-doped sub-region 2. To this end, the wall of the opening 5 is provided with an electrically insulating layer 6 by means of thermal oxidation. As an alternative, it may also be possible for an electrically insulating layer 6 to be applied to the wall of the opening 5.

The opening 5 is then refilled metallically in a further method step, shown in FIG. 1E, such that a metallic contact element 7 is formed in the opening 5 which connects the first main surface 12 and the second main surface 13 of the semiconductor body 1 to one another. The metallic contact element 7, which is produced for example by galvanic deposition or plating and which may comprise nickel and/or copper, takes the form, in the finished semiconductor chip 10 of an electrical via through the semiconductor body 1 next to the diode part, which is formed by the p-doped sub-region 2 and the n-doped sub-region 3.

Figure 1F:
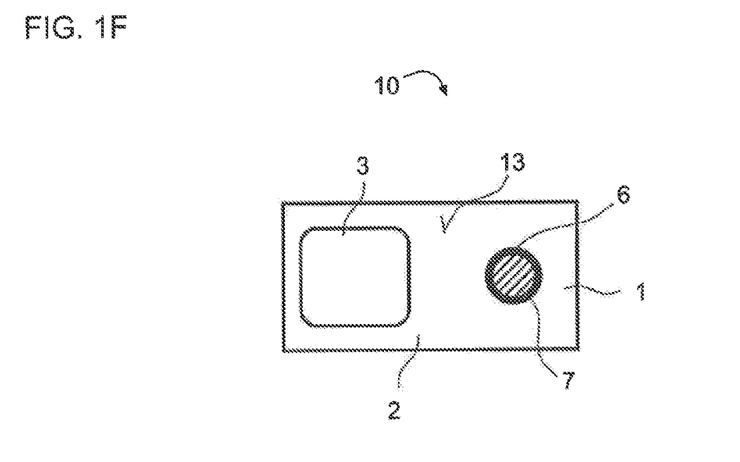
Figure 1G:
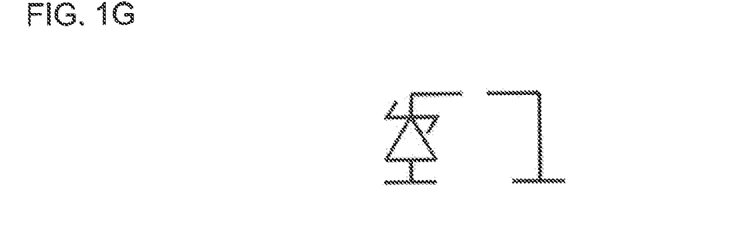

In addition to the sectional representation of FIG. 1E, FIG. 1F shows the semiconductor chip 10 in plan view onto the second main surface 13. FIG. 1G shows a corresponding equivalent circuit diagram of the semiconductor chip 10 with the ESD protection diode formed by the sub-regions 2, 3 and the electrical bushing formed by the metallic contact element 7.

As a result of the electrically insulating region 4, the metallic contact element 7 is electrically insulated from the p-doped sub-region 2 at the first main surface 12, such that at the first main surface 12 the diode and the electrical bushing may be electrically connected separately of one another.

Figure 2A:
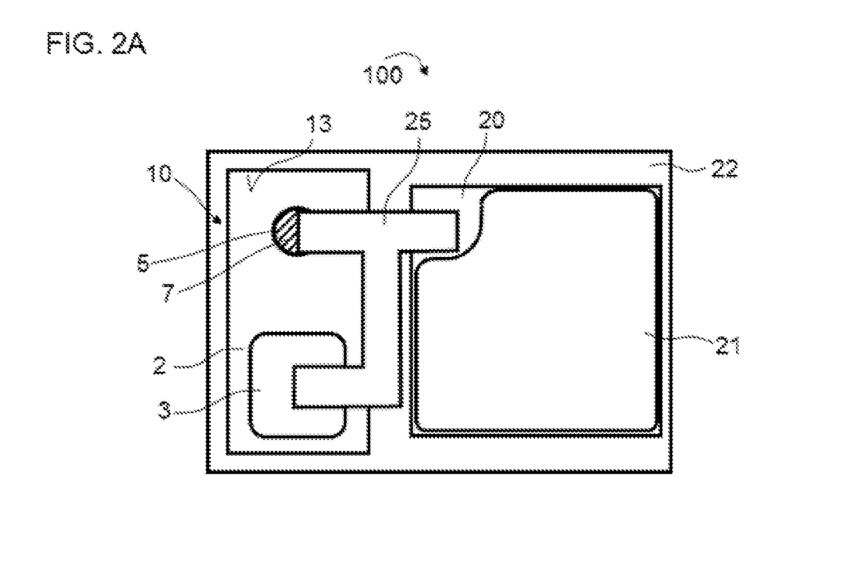
FIGS. 2A to 2C are schematic representations of an optoelectronic device with a semiconductor chip according to a further exemplary embodiment.
Figure 2B:
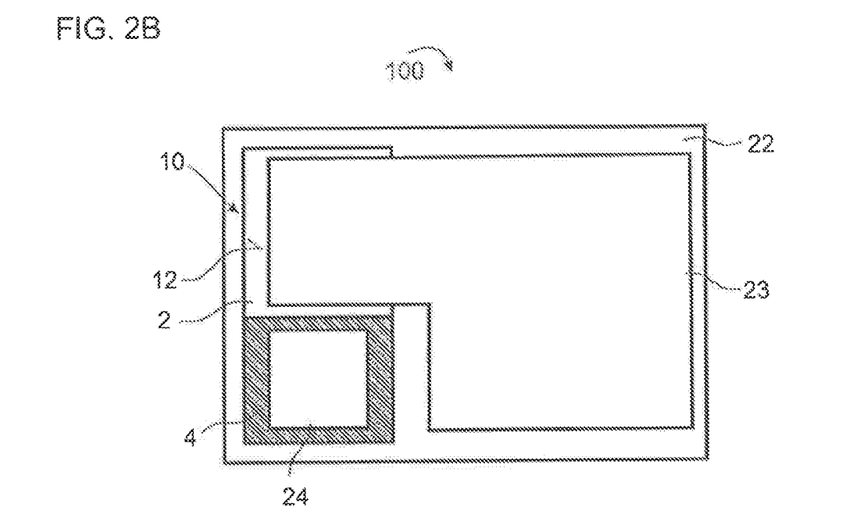
Figure 2C:
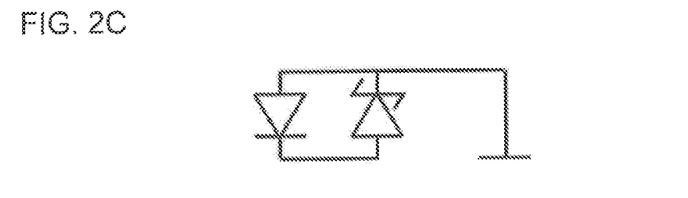

FIGS. 2A to 2C show various views and an equivalent circuit diagram of an optoelectronic device 100 which comprises a semiconductor chip 10 according to the previous exemplary embodiment. FIG. 2A here corresponds to a plan view onto a top of the optoelectronic device 100, faced by the second main surface 13 of the semiconductor chip 10, while FIG. 2B shows a plan view onto a mounting side of the optoelectronic device 100, faced by the first main surface 12 of the semiconductor chip 10.

The optoelectronic device 100 comprises, in addition to the semiconductor chip 10, an optoelectronic semiconductor component 20 which is designed to detect or emit light when in operation. In the exemplary embodiment shown, the optoelectronic semiconductor component 20 is configured purely by way of example as a light-emitting diode chip which comprises a light-transmitting main surface which faces the top of the optoelectronic device 100 and via which the optoelectronic semiconductor component 20 may emit light when in operation. In the exemplary embodiment shown, a wavelength conversion element 21 is further applied to the light-transmitting main surface of the semiconductor component 20, which wavelength conversion element 21 may convert some of the light generated by the optoelectronic semiconductor component when in operation into light of a different wavelength. As an alternative to the exemplary embodiment shown, the optoelectronic semiconductor component 20 may for example also take the form of a laser diode chip or a photodiode chip. Furthermore, further or other optical components such as for example a diffuser element and/or a lens may also be arranged over the optoelectronic semiconductor component 20. The optoelectronic semiconductor component 20 is electrically contacted on each of the main surfaces, such that the semiconductor component 20 has an electrical connection option on each of its top and bottom, for example in the form of an electrode layer.

The optoelectronic device 100 additionally comprises a package body 22, which form-fittingly encloses the semiconductor chip 10 and the optoelectronic semiconductor component 20 at their respective side faces. The side faces of the semiconductor chip 10 and of the optoelectronic semiconductor component 20 are those respective surfaces which connect the respective main surfaces.

The package body 22 may in particular take the form of a molding of a plastics material or a low-melting glass or a low-melting glass-ceramic and be produced using a molding process as described in the introductory part, by which the semiconductor chip 10 and the optoelectronic semiconductor component 20 are encapsulated in the material of the package body 22.

The package body forms, together with the semiconductor chip 10 and the optoelectronic semiconductor component 20, an "Embedded Wafer Level" component, which may be produced in a composite with a plurality of such components, which may be subdivided by dicing the package body material into individual optoelectronic devices 100. The package body 22 thus forms in the composite an artificial wafer in which a plurality of semiconductor chips 10 and optoelectronic semiconductor components 20 are arranged.

On the mounting side of the optoelectronic device 100 shown in FIG. 2B, two mutually isolated electrical connecting elements 23, 24 are arranged, which take the form of electrode layers, for example comprising or consisting of copper and/or nickel. The electrical connecting element 23 here extends partly over the first main surface 12 of the semiconductor chip 10 facing the mounting side and over the main surface of the optoelectronic semiconductor component 20 facing the mounting side, such that these are connected together electrically conductively. In other words, a back, i.e. a side opposite the light-transmitting main surface, of the optoelectronic semiconductor component 20 is connected electrically conductively with the p-doped sub-region 2 of the semiconductor chip 10. The further connecting element 24 on the mounting side of the optoelectronic device 100 is arranged on the electrically insulating region 4 and thus is only in electrical contact with the metallic contact element 7.

As is clear from FIG. 2A, a further electrical connecting element 25 in the form of a further electrode layer is arranged on the top of the optoelectronic device 100 opposite the mounting side, which electrode layer electrically conductively connects the n-doped sub-region 3 both with the metallic contact element 7 and with the top of the optoelectronic semiconductor component 20. The electrical connecting element 25 may in this case be electrically insulated from the p-doped sub-region 2 by means of a suitable insulator layer on the second main surface 13 of the semiconductor chip 10 (not shown).

As is visible in FIGS. 2A and 2B and also in the equivalent circuit diagram of FIG. 2C, the optoelectronic semiconductor component 20 is connected at the front, i.e. the light-transmitting main surface, which is a p-side of the semiconductor component 20, via the metallic contact element 7 with the back. At the same time, the p-side of the semiconductor component 20 is electrically conductively connected with the n-doped sub-region 3 of the diode part of the semiconductor chip 10. At the back, the n-side of the optoelectronic semiconductor component 20 is accordingly connected with the p-doped sub-region 2 and thus with the p-side of the diode part of the semiconductor chip 10, while the metallic contact element 7, as a metallic through-via isolated therefrom, forms the contact to the p-side of the optoelectronic semiconductor component 20. In comparison with corresponding known devices, in which the electrical bushing has to be produced and positioned separately from an ESD chip, all that remains to be done in the case of the optoelectronic device 100 shown here is to position, in addition to the optoelectronic semiconductor component 20, a single component in the form of the semiconductor chip 10 which has both functionalities, i.e. an ESD protection function and a metallic bushing isolated electrically therefrom.

FIGS. 3A to 3E shows a further exemplary embodiment of a method for producing a semiconductor chip 10.

Figure 3A:
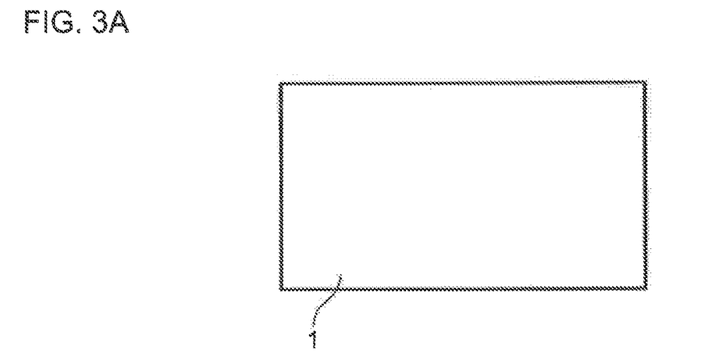
FIGS. 3A to 3E are schematic representations of method steps of a method for producing a semiconductor chip according to a further exemplary embodiment.

In a first method step, which is shown in FIG. 3A, as in the method of FIGS. 1A to 1G a semiconductor body 1 is provided which is doped with a first conductivity type. As in the previous exemplary embodiment, the semiconductor body 1 may comprise silicon which is p-doped. The semiconductor body 1 is configured in the exemplary embodiment shown as a semiconductor wafer, which is provided to produce a plurality of semiconductor chips 10.

Figure 3B:
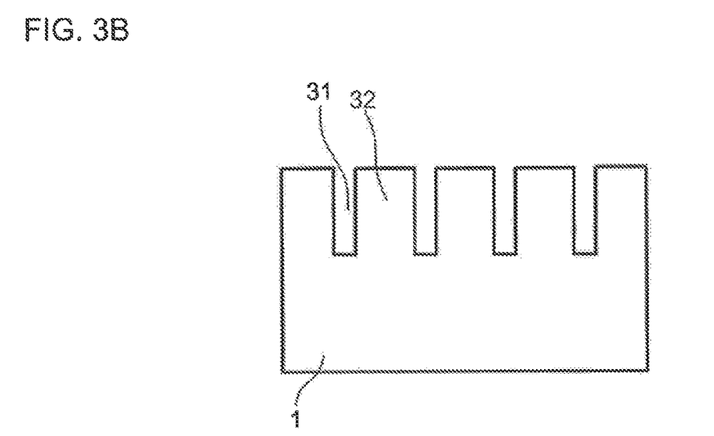

In a further method step, which is shown in FIG. 3B, the semiconductor body 1 is provided from one side with trenches 31 and projections 32 arranged therebetween.

The trenches 31 may for example be produced by an etching method. The projections 32 are separated from one another by the trenches 31.

Figure 3C:
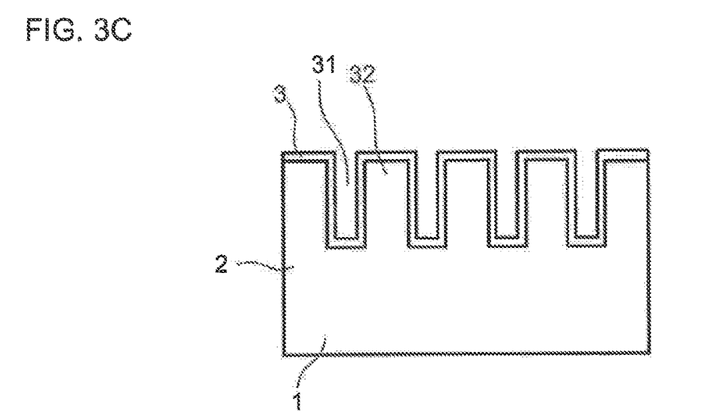

In a further method step, which is shown in FIG. 3C, the side with the trenches 31 and the projections 32 is configured over a large area as a sub-region of the second conductivity type. In the exemplary embodiment shown, an n-doped sub-region 3 is formed by corresponding n-doping on the entire surface of the semiconductor body 1 formed by the trenches 31 and the projections 32, while the remainder of the semiconductor body 1 forms a p-doped sub-region 2.

Figure 3D:
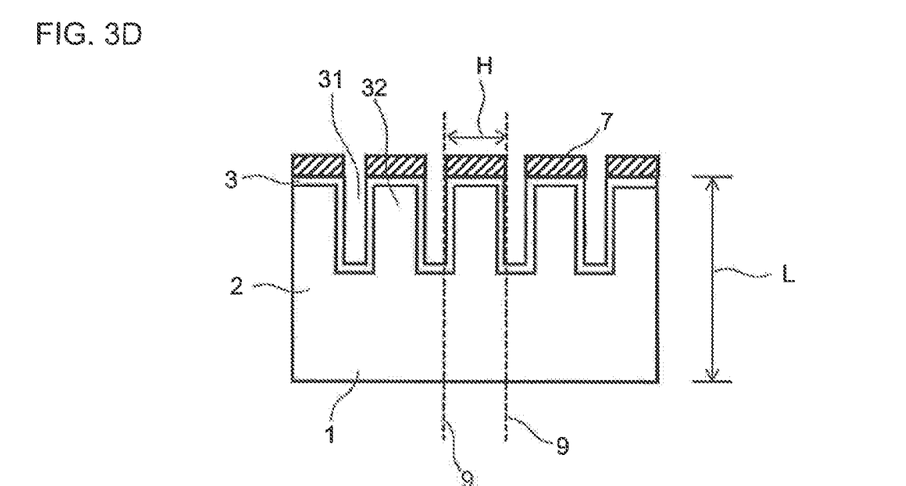

In a further method step, which is shown in FIG. 3D, the top of the projections 32 is provided with metallization. In particular, a plurality of metallic contact elements 7 are applied to the projections 32 between the trenches 31 on the n-doped sub-region 3, for example by galvanic deposition or plating.

Figures 3E, 4:
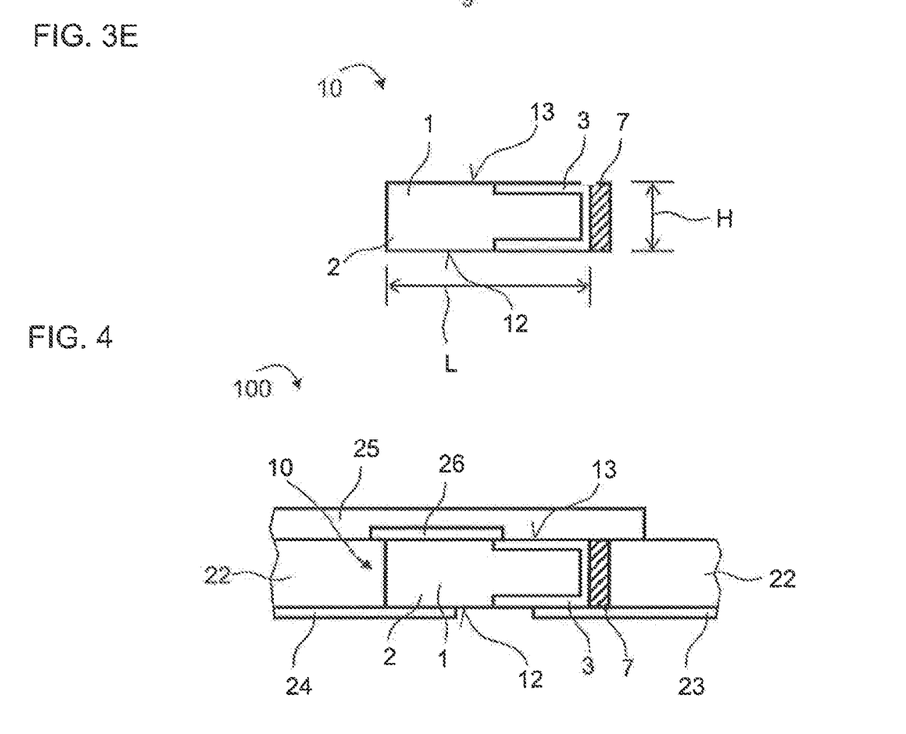
FIG. 4 is a schematic representation of a portion of an optoelectronic device with a semiconductor chip according to a further exemplary embodiment.

In a further method step, the semiconductor body 1 still in the form of a semiconductor wafer is singulated along dividing lines 9 indicated by way of example in FIG. 3D along the trenches 31 in such a way that a plurality of semiconductor chips 10 is produced, the first and second main surfaces of which are produced at least in part by the singulation. FIG. 3E shows a corresponding semiconductor chip 10, which for example has a height H of 120 μm and a length L of 200 μm, these also being shown in FIG. 3D for the sake of clarification.

FIG. 4 shows a schematic view of a portion of an optoelectronic device 100 with a semiconductor chip 10 produced using the method of FIGS. 3A to 3E. The semiconductor chip 10 is introduced in a tilted manner into the artificial wafer formed by the package body 22 and, like the semiconductor chip 10 described in conjunction with FIGS. 1A to 1G, may provide both an ESD function and a bushing. The optoelectronic device 100 of FIG. 4 constitutes a modification of the exemplary embodiment shown in FIGS. 2A to 2C and merely shows, in sectional representation, the region in which the semiconductor chip 10 is arranged.

The electrical connecting elements 23, 24, 25 correspond to the electrical connecting elements 23, 24, 25 of the exemplary embodiment of FIGS. 2A to 2C, wherein FIG. 4 additionally shows an electrically insulating layer 26 for insulating the p-doped sub-region 2 at the second main surface 13 from the electrical connecting element 25.

The exemplary embodiments described in conjunction with the figures may alternatively or additionally comprise further features according to the introductory part of the description.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic device comprising:
   a semiconductor body with a first main surface and a second main surface arranged opposite the first main surface, wherein the semiconductor body comprises a p-doped sub-region, which forms a part of the first main surface, and an n-doped sub-region, which forms a part of the second main surface;
   a metallic contact element extending from the first main surface to the second main surface, wherein the n-doped sub-region electrically isolates the p-doped sub-region from the metallic contact element; and
   a package body laterally surrounding the semiconductor body and having a first surface and a second surface,
   wherein the package body comprises a plastics material, a silicone, an epoxide, a silicone-epoxide hybrid material, a polyester, a low-melting glass or a low-melting glass-ceramic,
   wherein the first main surface of the of the semiconductor body is coplanar with the first surface of the package body and the second main surface of the semiconductor body is coplanar with the second surface of the package body, and
   wherein the metallic contact element is in direct contact with the package body.

2. The optoelectronic device according to claim 1, wherein the p-doped sub-region extends from the first main surface to the second main surface.

3. The optoelectronic device according to claim 1, wherein the p-doped sub-region forms also a part of the second main surface.

4. The optoelectronic device according to claim 1, wherein a part of the p-doped sub-region is sandwiched between the n-doped sub-region in a direction from the first main surface to the second main surface.

5. The optoelectronic device according to claim 1, wherein the semiconductor body has exactly one p-doped sub-region and exactly one n-doped sub-region.

6. The optoelectronic device according to claim 1, further comprising:
   a first electrical connecting element arranged on the first main surface of the semiconductor body;
   a second electrical connecting element arranged on the first main surface of the semiconductor body, the first electrical connecting element spaced apart from the second electrical connecting element; and
   a third electrical connecting element arranged on the second main surface of the semiconductor body.

7. The optoelectronic device according to claim 6, further comprising an insulating layer arranged on the second main surface of the semiconductor body such that the insulating layer insulates the p-doped sub-region from the third electrical connecting element.

8. The optoelectronic device according to claim 7, wherein the first electrical connecting element is electrically connected to the p-doped sub-region, wherein the second electrical connecting element is electrically connected to the n-doped sub-region, wherein the third electrical connecting element is electrically connected to the n-doped sub-region, and wherein the metallic contact element electrically connects the second electrical connecting element with the third electrical connecting element.

9. The optoelectronic device according to claim 1, wherein the optoelectronic device is configured to protect against electrostatic discharge.

10. The optoelectronic device according to claim 1, wherein the n-doped sub-region is extended at the first and second main surfaces in a direction orthogonal to a direction from the first main surface to the second main surface.

11. An optoelectronic device comprising:
    a semiconductor chip comprising:
       a semiconductor body with a first main surface, a second main surface arranged opposite the first main surface and side surfaces forming a $a_3$-dimensional outer shape of the semiconductor body, wherein the semiconductor body comprises a p-doped sub-region, which forms a part of the first main surface, and an n-doped sub-region, which forms a part of the second main surface; and
       a metallic contact element extending from the first main surface to the second main surface, wherein the n-doped sub-region electrically isolates the p-doped sub-region from the metallic contact element, and wherein the metallic contact element is arranged on a side surface of the side surfaces of the semiconductor body connecting the first and second main surfaces;
    a package body laterally surrounding the semiconductor chip and having a first surface and a second surface, wherein the package body comprises a plastics material, a silicone, an epoxide, a silicone-epoxide hybrid material, a polyester, a low-melting glass or a low-melting glass-ceramic, wherein the first surface of the of the semiconductor body is coplanar with the first surface of the package body and the second main surface of the semiconductor body is coplanar with the second surface of the package body, and wherein the metallic contact element is in direct contact with the package body;
    a first electrical connecting element arranged on the first main surface of the semiconductor chip;
    a second electrical connecting element arranged on the first main surface of the semiconductor chip, the first electrical connecting element spaced apart from the second electrical connecting element; and
    a third electrical connecting element arranged on the second main surface of the semiconductor chip,
    wherein the semiconductor chip is configured to protect against electrostatic discharge.

12. A optoelectronic device comprising:
    a semiconductor body with a first main surface, a second main surface arranged opposite the first main surface and side main surfaces forming a 3-dimensional outer shape of the semiconductor body, wherein the semiconductor body comprises a p-doped sub-region, which forms a part of the first main surface, and an n-doped sub-region, which forms a part of the second main surface;
    a metallic contact element extending from the first main surface to the second main surface, wherein the n-doped sub-region electrically isolates the p-doped sub-region from the metallic contact element; and a package body laterally surrounding the semiconductor body and having a first surface and a second surface, wherein the package body comprises a plastics material, a silicone, an epoxide, a silicone-epoxide hybrid material, a polyester, a low-melting glass or a low-melting glass-ceramic, wherein the first main surface of the of the semiconductor body is coplanar with the first surface of the package body and the second main surface of the semiconductor body is coplanar with the second surface of the package body, wherein the metallic contact element is in direct contact with the package body, and wherein the metallic contact element is arranged on a side face of the side surfaces of the semiconductor body connecting the first and second main surfaces.

* * * * *